US012566989B2

(12) United States Patent
Hasegawa et al.

(10) Patent No.: US 12,566,989 B2
(45) Date of Patent: Mar. 3, 2026

(54) SUPERCONDUCTING CIRCUIT AND QUANTUM COMPUTER

(71) Applicant: NEC Corporation, Tokyo (JP)

(72) Inventors: Masahiro Hasegawa, Tokyo (JP);
Tsuyoshi Yamamoto, Tokyo (JP);
Yoshihito Hashimoto, Tokyo (JP)

(73) Assignee: NEC CORPORATION, Tokyo (JP)

( * ) Notice: Subject to any disclaimer, the term of this
patent is extended or adjusted under 35
U.S.C. 154(b) by 1087 days.

(21) Appl. No.: 17/626,971

(22) PCT Filed: Jun. 26, 2020

(86) PCT No.: PCT/JP2020/025253
§ 371 (c)(1),
(2) Date: Jan. 13, 2022

(87) PCT Pub. No.: WO2021/014889
PCT Pub. Date: Jan. 28, 2021

(65) Prior Publication Data
US 2022/0318660 A1      Oct. 6, 2022

(30) Foreign Application Priority Data

Jul. 19, 2019     (JP) ................................. 2019-133819

(51) Int. Cl.
| | |
|---|---|
| *G06N 10/40* | (2022.01) |
| *G06N 10/60* | (2022.01) |
| *H10N 60/12* | (2023.01) |
| *H10N 69/00* | (2023.01) |

(52) U.S. Cl.
CPC ............. *G06N 10/40* (2022.01); *G06N 10/60*
(2022.01); *H10N 60/12* (2023.02); *H10N*
*69/00* (2023.02)

(58) Field of Classification Search
CPC ......... G06N 10/40; G06N 10/60; H10N 60/12
See application file for complete search history.

(56) References Cited

U.S. PATENT DOCUMENTS

2018/0341874 A1* 11/2018 Puri ....................... G06N 10/40

OTHER PUBLICATIONS

International Search Report for PCT Application No. PCT/JP2020/
025253, mailed on Oct. 6, 2020.
(Continued)

*Primary Examiner* — Paul A Wartalowicz
(74) *Attorney, Agent, or Firm* — Sughrue Mion, PLLC

(57) ABSTRACT
A superconducting circuit and a quantum computer capable
of implementing four-body interaction using a plurality of
superconducting qubit circuits supplied with signals of the
same frequency are provided. A superconducting circuit (1)
includes four superconducting qubit circuits (10), a coupling
circuit (20) directly connected to the four superconducting
qubit circuits (10). Each of the superconducting qubit cir-
cuits (10) indicates a qubit by being in a first phase state or
a second phase state, when the number of the superconduct-
ing qubit circuits (10) in the first phase state among the four
superconducting qubit circuits (10) is an even number, an
interaction term of Hamiltonian of the superconducting
circuit (1) takes a first value, and when the number of the
superconducting qubit circuits (10) in the first phase state
among the four superconducting qubit circuits (10) is an odd
number, the interaction term takes a second value.

8 Claims, 6 Drawing Sheets

(56) References Cited

OTHER PUBLICATIONS

W. Lechner, et al., "A quantum annealing architecture with all-to-all connectivity from local interactions", Science Advances, Oct. 23, 2015, vol. 1, No. 9, e1500638, pp. 1-6.

S. Puri, et al., "Quantum annealing with all-to-all connected non-linear oscillators," Nature Communications, Published Jun. 8, 2017, DOI: 10.1038/ncomms15785, pp. 1-9.

Puri, Shruti et al., "Quantum annealing with a network of all-to-all connected, two-photon driven Kerr nonlinear oscillators". arXiv <Internet: https://arxiv.org/abs/1609.07117v1>. Sep. 22, 2016, pp. 1-19.

* cited by examiner

3

4

SUPERCONDUCTING CIRCUIT AND QUANTUM COMPUTER

This application is a National Stage Entry of PCT/JP2020/025253 filed on Jun. 26, 2020, which claims priority from Japanese Patent Application 2019-133819 filed on Jul. 19, 2019, the contents of all of which are incorporated herein by reference, in their entirety.

TECHNICAL FIELD

The present disclosure relates to a superconducting circuit and a quantum computer.

BACKGROUND ART

Solving a combinatorial optimization problem can be replaced by finding a ground state of the Ising model, in other words, finding the state of each spin that minimizes the Hamiltonian of the Ising model. Here, the Ising model is a system in which a plurality of spins capable of being in either an upward or downward state interact with each other. The quantum annealing circuit (the quantum annealing computer) realizes this Ising model as a circuit, and this circuit is constituted by coupling a plurality of qubit circuits regarded as spins to each other. Each qubit circuit can be in either an upward or a downward state.

In order to improve the performance of the quantum annealing circuit, it is required to couple all the qubit circuits, that is, to couple all the qubit circuits with all the qubit circuits other than the qubit circuit of interest. However, the greater the number of bits in the quantum annealing circuit, i.e., the number of qubit circuits, the more difficult it is to implement full coupling in hardware. As a method for solving this difficulty, full coupling by a method called an LHZ scheme has been proposed (Non Patent Literature 1). In the LHZ scheme, two interacting spins are replaced with a single spin to visually eliminate the interaction between the spins and simplify the implementation of full coupling in hardware. However, it is necessary to satisfy a constraint. This constraint is for the interaction between four spins and is called a four-body interaction. In order to form a quantum annealing circuit in accordance with the LHZ scheme, this four-body interaction must be implemented in hardware. As a method of implementing the four-body interaction, Non Patent Literature 2 describes a configuration of four-body interaction when a superconducting parametric oscillator is used as a superconducting qubit circuit. In this configuration, four superconducting parametric oscillators are coupled by one coupling circuit.

CITATION LIST

Non Patent Literature

Non Patent Literature 1: W. Lechner, et al., "A quantum annealing architecture with all-to-all connectivity from local interactions", Science Advances 23, 2015, Vol. 1, no. 9, e1500838.
Non Patent Literature 2: S. Puri, et al., "Quantum annealing with all-to-all connected nonlinear oscillators", Nature Comm., 2017.

SUMMARY OF INVENTION

Technical Problem

In order to operate a superconducting parametric oscillator, it is necessary to supply a high-frequency signal to the superconducting parametric oscillator. However, when the configuration of Non Patent Literature 2 is used, high frequency signals having different frequencies must be supplied to the four superconducting parametric oscillators. Furthermore, if the four frequencies are $\omega_1$, $\omega_2$, $\omega_3$, and $\omega_4$, there is a constraint that the relationship of $\omega_1+\omega_2=\omega_3+\omega_4$ must be satisfied. Therefore, there is a problem that four high-frequency signal generators must be used, thereby complicating the configuration and operation of the quantum annealing system.

An object of the present disclosure is to provide a superconducting circuit and a quantum computer capable of implementing four-body interaction using a plurality of superconducting qubit circuits supplied with signals of the same frequency.

Solution to Problem

In an example aspect, a superconducting circuit includes:
four superconducting qubit circuits; and
a coupling circuit directly connected to the four superconducting qubit circuits.
Each of the superconducting qubit circuits indicates a qubit by being in a first phase state or a second phase state,
  when the number of the superconducting qubit circuits in the first phase state among the four superconducting qubit circuits is an even number, an interaction term of Hamiltonian of the superconducting circuit takes a first value, and
  when the number of the superconducting qubit circuits in the first phase state among the four superconducting qubit circuits is an odd number, the interaction term takes a second value.
In another example aspect, a superconducting circuit includes:
  a plurality of superconducting qubit circuits; and
  a coupling circuit directly connected to the plurality of superconducting qubit circuits.
The coupling circuit includes a plurality of sub-coupling circuits each including a plurality of capacitors and one Josephson junction,
  each of the plurality of superconducting qubit circuits is connected to either one of both terminals of the Josephson junction of each of the plurality of sub-coupling circuits through any one of the plurality of capacitors, and
  each sub-coupling circuit has a different combination of the superconducting qubit circuits connected to the respective terminals of the Josephson junction.

Advantageous Effects of Invention

According to the above configuration, it is possible to provide a superconducting circuit and a quantum computer capable of implementing four-body interaction using a plurality of superconducting qubit circuits supplied with signals of the same frequency.

EXAMPLE EMBODIMENTS

The details of the example embodiments will be described below. A superconducting circuit according to example embodiments is implemented, for example, by lines which are wiring composed of a superconductor on a silicon substrate. For example, niobium (Nb) or aluminum (Al) is used as a material of these lines, but any other metal which becomes a superconducting state when cooled to a very low temperature such as molybdenum (Mo) or tantalum (Ta) may be used. In order to achieve the superconducting state, a superconducting circuit is used in a temperature environment of, for example, about 10 milli-Kelvin (mK) achieved by a refrigerator.

In the following description, a Josephson junction refers to an element having a structure in which a thin insulating film is sandwiched between a first superconductor and a second superconductor.

The Hamiltonian of a plurality of qubit circuits is a sum of terms related to interaction between the qubit circuits, which are hereinafter referred to as interaction terms, and terms not related to the interaction. In order to satisfy the above-mentioned constraint, the four-body interaction terms, namely, the terms indicating the interaction of the four qubit circuits, must have the following characteristics. The characteristics are that when the number of upward spins is 0, 2, or 4, the four-body interaction terms have the same value, which is referred to as a first value, while when the number of upward spins is 1 or 3, the four-body interaction terms have the same value, which is referred to as a second value different from the first value. That is, it is necessary to have the same first value when the number of upward spins is even, and have the same second value when the number of upward spins is odd. Depending on the circuit to be designed, the terms indicating the interaction between less than four bodies and terms indicating the interaction between five or more bodies may be generated. However, the constraint requested by the LHZ scheme requires that only four-body interaction terms with the characteristics described above be present. Thus, if a circuit in which only four-body interaction terms having the above-described characteristics are present can be designed, the four-body interaction for the LHZ scheme can be implemented. Hereinafter, a superconducting circuit that implements the four-body interaction using a plurality of superconducting qubit circuits supplied with signals of the same frequency will be described.

First Example Embodiment

Figure 1:
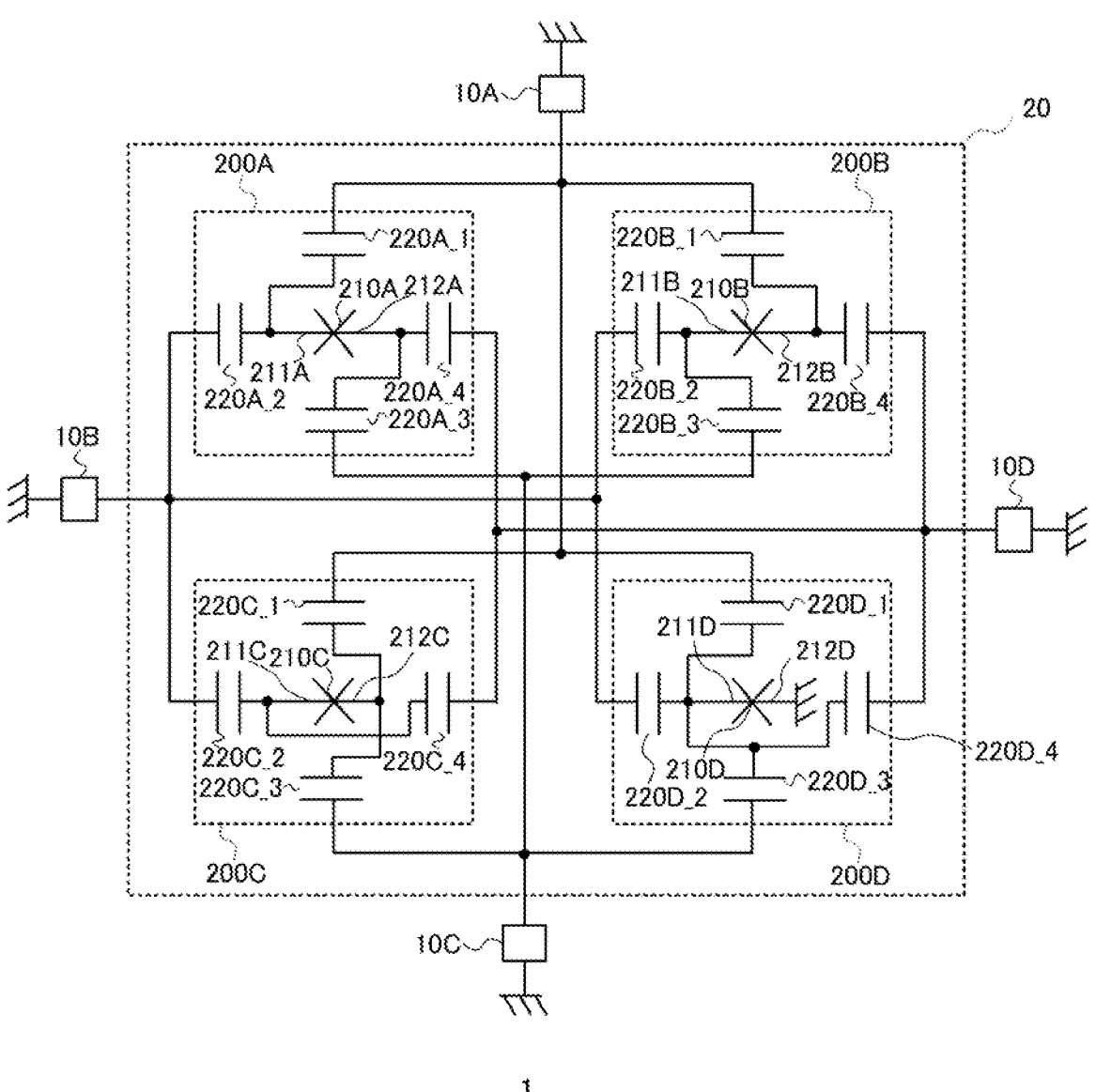
FIG. 1 is a schematic diagram showing a configuration of a superconducting circuit according to a first example embodiment.

FIG. 1 is a schematic diagram showing a configuration of a superconducting circuit 1 according to a first example embodiment. As shown in FIG. 1, the superconducting circuit 1 has four superconducting qubit circuits 10A, 10B, 10C, and 10D, and one coupling circuit 20 directly connected to four the superconducting qubit circuits 10A, 10B, 10C, and 10D. In the following description, the superconducting qubit circuits 10A, 10B, 10C, and 10D are referred to as superconducting qubit circuits 10 when they are referred to without any particular distinction between them.

All of the four superconducting qubit circuits 10 have the same configuration. Each of the superconducting qubit circuits 10 can be in either a first phase state or a second phase state. Each of the superconducting qubit circuits 10 indicates a qubit by being in the first phase state or the second phase state. Here, the first phase state corresponds to an upward spin and the second phase state corresponds to a downward spin. In this example embodiment, a phase in the first phase state and a phase in the second phase state of the superconducting qubit circuit 10 have the same absolute value but have signs opposite to each other. However, the absolute value of the phase in the first state may not be completely the same as the absolute value of the phase in the second state, and there may be a difference of about ±10% between these phases. In this example embodiment, the superconducting qubit circuits 10 are specifically superconducting parametric oscillators.

Figure 2:
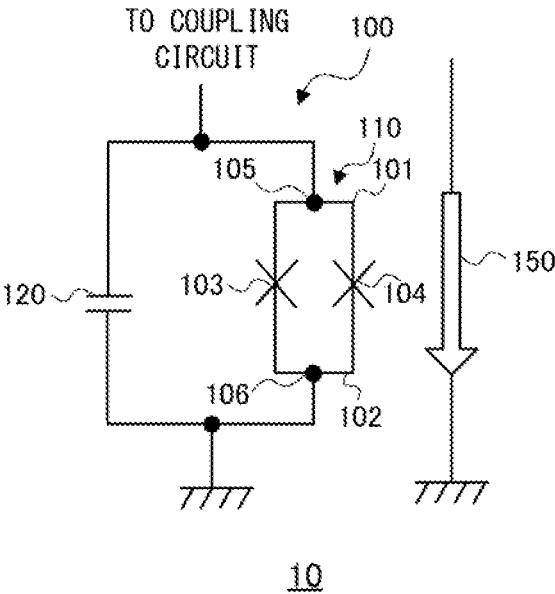
FIG. 2 is a schematic diagram showing a configuration of a superconducting qubit circuit.

As shown in FIG. 2, the superconducting parametric oscillator (the superconducting qubit circuit 10) includes a resonator 100 and a magnetic field generation unit 150. The resonator 100 includes a loop circuit 110 and a capacitor 120. The loop circuit 110 includes a first superconducting line 101 for connecting a first Josephson junction 103 to a second Josephson junction 104, and a second superconducting line 102 for connecting the first Josephson junction 103 to the second Josephson junction 104. In other words, the resonator 100 includes the loop circuit 110 in which the first superconducting line 101 and the second superconducting line 102 are connected by the first Josephson junction 103 and the second Josephson junction 104, and the capacitor 120. As shown in FIG. 2, the first superconducting line 101, the first Josephson junction 103, the second superconducting line 102, and the second Josephson junction 104 are connected in a ring shape (i.e., in a circular fashion), thereby forming the loop circuit 110. In other words, in the loop circuit 110, the first and second superconducting lines 101 and 102 are joined by the first and second Josephson junctions 103 and 104, thereby forming a loop. That is, it can also be said that the loop circuit 110 is a DC-SQUID (Superconducting QUantum Interference Device).

The loop circuit 110 is shunted by the capacitor 120. That is, a first part 105 of the first superconducting line 101 and a second part 106 of the second superconducting line 102 are shunted by the capacitor 120. In other words, in the resonator 100, input/output ends of the DC-SQUID are shunted by the capacitor 120. That is, it can be said that, by connecting the capacitor 120 and the loop circuit 110 in a ring shape, a loop circuit in which the loop circuit 110 is incorporated on the line of the loop is formed. Here, the first part 105 is any part of the first superconducting line 101. That is, a position of the first part 105 in the first superconducting line 101 is not particularly limited. Similarly, the second part 106 is any part of the second superconducting line 102. That is, the position of the second part 106 in the second superconducting line 102 is not particularly limited.

While the resonator 100, which is the loop circuit composed of the loop circuit 110 and the capacitor 120 connected in a ring shape, is used as one example of the oscillator in the configuration shown in FIG. 2, a resonator having another configuration may be used as the superconducting parametric oscillator. For example, the loop circuit constituting the resonator may further include other circuit elements. That is, it is sufficient that the resonator be a loop circuit composed of at least the loop circuit 110 and the capacitor 120 connected in a ring shape. As shown in FIG. 2, one end of the loop circuit in which the loop circuit 110 and the capacitor 120 are connected in a ring shape may be grounded.

The magnetic field generation unit 150 is magnetically coupled to the loop circuit 110 through a mutual inductance. In other words, the magnetic field generation unit 150 and the loop circuit 110 are inductively coupled to each other. The magnetic field generation unit 150 is a circuit that generates an alternating magnetic field and applies the alternating magnetic field to the loop circuit 110. The magnetic field generation unit 150 is a circuit through which an alternating current flows, and generates an alternating magnetic field by the alternating current. More specifically, a current in which a direct current and an alternating current are superimposed flows through the magnetic field generation unit 150. The frequency of the generated alternating magnetic field is equal to the frequency of this alternating current. The magnitude of the magnetic flux and the height of the oscillation frequency (resonance frequency) are controlled by the amount of the direct current. The resonance frequency of the resonator 100, that is, the oscillation frequency of the superconducting parametric oscillator (the superconducting qubit circuit 10) depends on an equivalent inductance of the loop circuit 110. The equivalent inductance depends on the magnitude of the magnetic flux passing through the loop of the loop circuit 110. The magnitude of the magnetic flux passing through the loop depends on the amount of the direct current flowing through the magnetic field generation unit 150. Thus, as described above, the height of the oscillation frequency (the resonance frequency) is controlled by the amount of the direct current. Although the magnetic field generation unit 150 is expressed by one wire in FIG. 2, the magnetic field generation unit 150 may be composed of two wired and configured in such a way that the direct current flows through one line and the alternating current flows through the other.

When an alternating magnetic field twice the resonance frequency of the resonator 100 is applied to the loop circuit 110 by causing the alternating current to flow through the magnetic field generation unit 150, the superconducting qubit circuit 10 oscillates at the resonance frequency (i.e., an oscillation frequency 0.5 times the frequency of the alternating magnetic field). Such oscillation is called parametric oscillation. The oscillation state at the time of parametric oscillation can be either a first oscillation state and a second oscillation state. The phase of the oscillation in the first oscillation state and the phase of the oscillation in the second oscillation state differ from each other by $\pi$. In the superconducting parametric oscillator, these two oscillation states correspond to the two phase states described above, respectively. That is, the superconducting parametric oscillator indicates a quantum bit depending on which oscillation state it is in. In other words, the first oscillation state and the second oscillation state correspond to 0 and 1, respectively, of the quantum bits.

In this example embodiment, the magnetic field generation units 150 of the four superconducting qubit circuits 10 generate alternating magnetic fields of the same frequency. That is, alternating currents of the same frequency flow through the magnetic field generation units 150 of the four superconducting qubit circuits 10. That is, signals of the same frequency are supplied to the four superconducting qubit circuits 10.

The loop circuit in which the loop circuit 110 and the capacitor 120 are connected in a ring shape is connected to the coupling circuit 20.

The coupling circuit 20 includes four sub-coupling circuits each including four capacitors and one Josephson junction. Specifically, as shown in FIG. 1, the coupling circuit 20 includes a sub-coupling circuit 200A, a sub-coupling circuit 200B, a sub-coupling circuit 200C, and a sub-coupling circuit 200D.

In the following description, when the sub-coupling circuits 200A, 200B, 200C, and 200D are referred to without any particular distinction between them, they are referred to as sub-coupling circuits 200.

When Josephson junctions 210A, 210B, 210C, and 210D of the sub-coupling circuits 200, which will be described later, are referred to without any particular distinction between them, they are referred to as Josephson junctions 210.

When capacitors 220A_1, 220A_2, 220A_3, and 220A_4 of the sub-coupling circuit 200A, which will be described later, are referred to without any particular distinction between them, they are referred to as capacitors 220A. When capacitors 220B_1, 220B_2, 220B_3, and 220B_4 of the sub-coupling circuit 200B, which will be described later, are referred to without any particular distinction between them, they are referred to as capacitors 220B. When capacitors 220C_1, 220C_2, 220C_3, and 220C_4 of the sub-coupling circuit 200C, which will be described later, are referred to without any particular distinction between them, they are referred to as capacitors 220C. When capacitors 220D_1, 220D_2, 220D_3, and 220D_4 of the sub-coupling circuit 200D, which will be described later, are referred to without any particular distinction between them, they are referred to as capacitors 220D. When the capacitors 220A, 220B, 220C, and 330D are referred to without any particular distinction between them, they are referred to as capacitors 220.

All of the four superconducting qubit circuits 10 are directly connected to all of the four sub-coupling circuits 200.

The sub-coupling circuit 200A is a circuit in which one Josephson junction 210A and four capacitors 220A_1, 220A_2, 220A_3, and 220A_4 are connected. The sub-coupling circuit 200B is a circuit in which one Josephson junction 210B and four capacitors 220B_1, 220B_2, 220B_3, and 220B_4 are connected. The sub-coupling circuit 200C is a circuit in which one Josephson junction 210C and four capacitors 220C_1, 220C_2, 220C_3, and 220C_4 are connected. The sub-coupling circuit 200D is a circuit in which one Josephson junction 210D and four capacitors 220D_1, 220D_2, 220D_3, and 220D_4 are connected.

Each of the four superconducting qubit circuits 10 is connected to either one of both terminals of the Josephson junction 210 of each of the four sub-coupling circuits 200 through any one of the four capacitors 220. Each sub-coupling circuit 200 has a different combination of superconducting qubit circuits 10 connected to the respective terminals of one Josephson junction 210.

Specifically, in this example embodiment, each superconducting qubit circuit 10 is connected to the four sub-coupling circuits 200 as follows.

The superconducting qubit circuit 10A and the superconducting qubit circuit 10B are connected to one terminal 211A of the Josephson junction 210A of a sub-coupling circuit 200A. More specifically, the superconducting qubit circuit 10A is connected to the terminal 211A through the capacitor 220A_1, and the superconducting qubit circuit 10B is connected to the terminal 211A through the capacitor 220A_2. The superconducting qubit circuit 10C and the superconducting qubit circuit 10D are connected to the other terminal 212A of the Josephson junction 210A of the sub-coupling circuit 200A. More specifically, the superconducting qubit circuit 10C is connected to the terminal 212A through the capacitor 220A_3, and the superconducting qubit circuit 10D is connected to the terminal 212A through the capacitor 220A_4.

The superconducting qubit circuit 10B and the superconducting qubit circuit 10C are connected to one terminal 211B of the Josephson junction 210B of the sub-coupling circuit 200B. More specifically, the superconducting qubit circuit 10B is connected to the terminal 211B through the capacitor 220B_2, and the superconducting qubit circuit 10C is connected to the terminal 211B through the capacitor 220B_3. The superconducting qubit circuit 10A and the superconducting qubit circuit 10D are connected to the other terminal 212B of the Josephson junction 210B of the sub-coupling circuit 200B. More specifically, the superconducting qubit circuit 10A is connected to the terminal 212B through the capacitor 220B_1, and the superconducting qubit circuit 10D is connected to the terminal 212B through the capacitor 220B_4.

The superconducting qubit circuit 10B and the superconducting qubit circuit 10D are connected to one terminal 211C of the Josephson junction 210C of the sub-coupling circuit 200C. More specifically, the superconducting qubit circuit 10B is connected to the terminal 211C through the capacitor 220C_2, and the superconducting qubit circuit 10D is connected to the terminal 211C through the capacitor 220C_4. The superconducting qubit circuit 10A and the superconducting qubit circuit 10C are connected to the other terminal 212C of the Josephson junction 210C of the sub-coupling circuit 200C. More specifically, the superconducting qubit circuit 10A is connected to the terminal 212C through the capacitor 220C_1, and the superconducting qubit circuit 10C is connected to the terminal 212C through the capacitor 220C_3.

The superconducting qubit circuit 10A, the superconducting qubit circuit 10B, the superconducting qubit circuit 10C, and the superconducting qubit circuit 10D are connected to one terminal 211D of the Josephson junction 210D of the sub-coupling circuit 200D. That is, all of the four superconducting qubit circuits 10 are connected to the terminal 211D. More specifically, the superconducting qubit circuit 10A is connected to the terminal 211D through the capacitor 220D_1. The superconducting qubit circuit 10B is connected to the terminal 211D through the capacitor 220D_2. The superconducting qubit circuit 10C is connected to the terminal 211D through the capacitor 220D_3. The superconducting qubit circuit 10D is connected to the terminal 211D through the capacitor 220D_4. The other terminal 212D of the Josephson junction 210D of the sub-coupling circuit 200D is grounded.

In this example embodiment, all capacitances of a total of 16 capacitors 220 of the respective sub-coupling circuits 200 are set to the same value. However, these capacitances need not be completely the same, and manufacturing variations of about ±10% are acceptable. In this example embodiment, the critical current values of all the Josephson junctions 210 of the respective sub-coupling circuits 200 are the same. However, these critical current values need not be completely the same, and manufacturing variations of about ±10% are acceptable.

The interaction term of the Hamiltonian of the superconducting circuit 1 shown in FIG. 1 will now be described. When the interaction term is calculated under the condition that signals of the same frequency are supplied to the four superconducting qubit circuits 10, the interaction term becomes only the term for the interaction of the four bodies shown by the following Formula (1).

$$[\text{Interaction term}] = E_J \cos[\varphi_1 + \varphi_2 - \varphi_3 - \varphi_4] + E_J \cos[-\varphi_1 + \varphi_2 + \varphi_3 - \varphi_4] + E_J \cos[-\varphi_1 + \varphi_2 - \varphi_3 + \varphi_4] + E_J \cos[\varphi_1 + \varphi_2 + \varphi_3 + \varphi_4] \quad (1)$$

In Formula (1), $\varphi_1$ is a phase of the superconducting qubit circuit 10A, $\varphi_2$ is a phase of the superconducting qubit circuit 10B, $\varphi_3$ is a phase of the superconducting qubit circuit 10C, and $\varphi_4$ is a phase of the superconducting qubit circuit 10D. $E_J$ is Josephson energy of the Josephson junction 210, and is expressed by Formula (2) below. In Formula (2), $\Phi_0$ indicates a magnetic flux quantum (about $2.07 \times 10^{-15}$ Wb), and $I_C$ indicates a critical current value of the Josephson junction 210.

$$E_J = \Phi_0 I_C / 2\pi \quad (2)$$

The phase of each superconducting qubit circuit 10 takes a value of $+\varphi_0$ if the superconducting qubit circuit 10 is an upward spin, i.e., in the first phase state, and a value of $-\varphi_0$ if the superconducting qubit circuit 10 is a downward spin, i.e., in the second phase state. Therefore, there are 16 combinations of $(\varphi_1, \varphi_2, \varphi_3, \varphi_4)$, which is 2 to the power of 4. Among the 16 combinations, there are eight combinations in which the number of upward spins is zero, two, or four. In this example embodiment, in any of these eight combinations, the above interaction term has the same value, which is the first value, as $E_J(3 + \cos[4\varphi_0])$. On the other hand, there are a total of eight combinations in which the number of upward spins is one or three. In this example embodiment, in any of these eight combinations, the above interaction term has the same value, which is the second value, as $4E_J \cos[2\varphi_0]$. In other words, when the number of superconducting qubit circuits 10 to be in the first phase state among the four superconducting qubit circuits 10 is an even number, the interaction term of the Hamiltonian of the superconducting circuit 1 takes the first value. When the number of superconducting qubit circuits 10 to be the first phase state among the four superconducting qubit circuits 10 is an odd number, the interaction term of the Hamiltonian of the superconducting circuit 1 takes the second value.

As described above, in this example embodiment, a circuit satisfying the four-body interaction, which is a constraint required by the LHZ scheme, is implemented using a plurality of superconducting qubit circuits 10 to which signals of the same frequency are supplied.

Second Example Embodiment

Next, a second example embodiment will be described. In the second example embodiment, a pattern of the combinations of the connection of each superconducting qubit circuit 10 to both terminals of the Josephson junction 210 differs from that according to the first example embodiment. Since the second example embodiment is the same as the first example embodiment except for the above, repeated descriptions will be omitted as appropriate.

Figure 3:
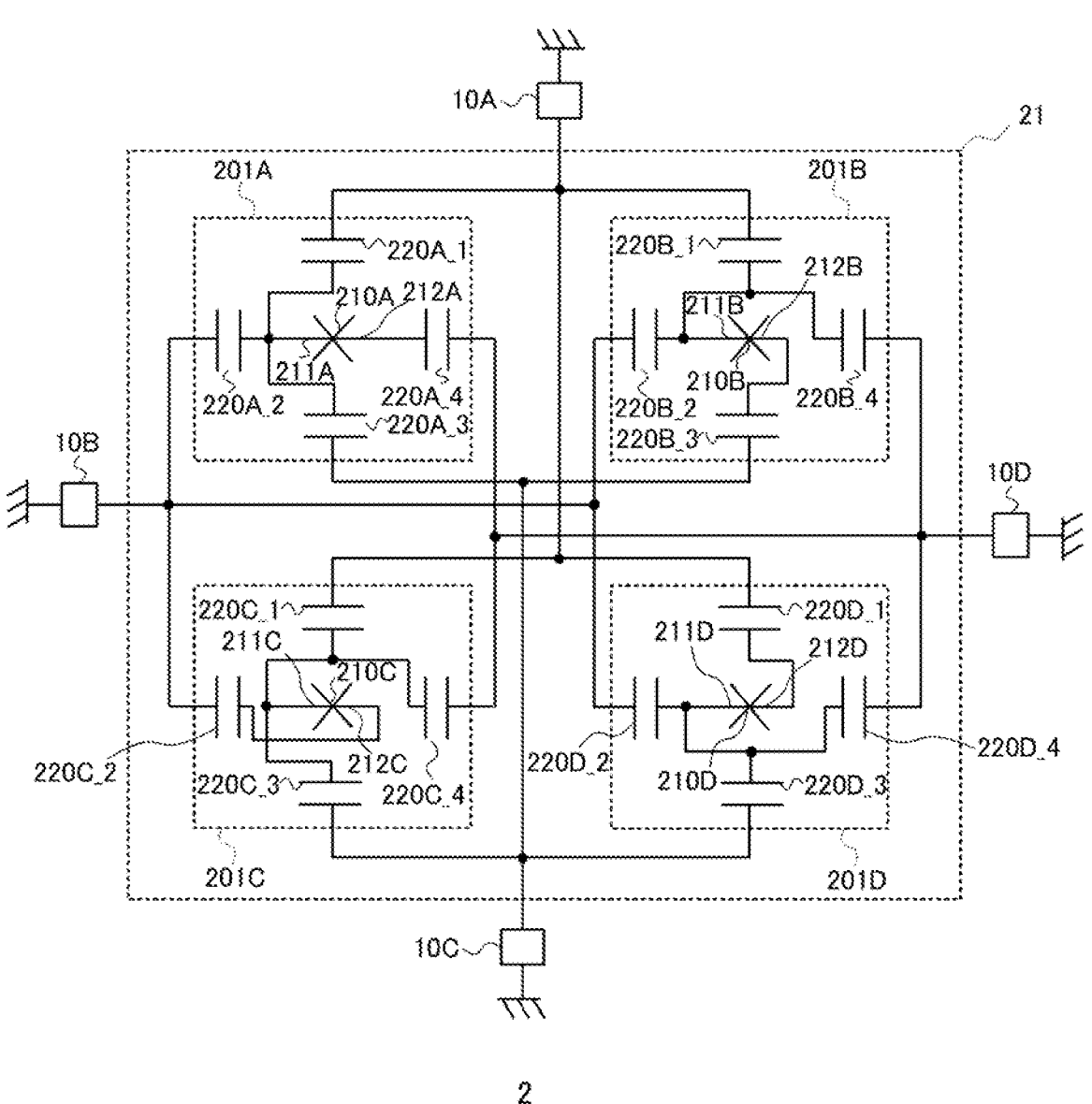
FIG. 3 is a schematic diagram showing a configuration of a superconducting circuit according to a second example embodiment.

FIG. 3 is a schematic diagram showing a configuration of a superconducting circuit 2 according to the second example embodiment. As shown in FIG. 3, the superconducting circuit 2 has four superconducting qubit circuits 10 and one coupling circuit 21 directly connected to the four superconducting qubit circuits 10. Also in this example embodiment, the magnetic field generation units 150 of the four superconducting qubit circuits 10 generate alternating magnetic fields of the same frequency. That is, alternating currents of the same frequency flow through the magnetic field generation units 150 of the four superconducting qubit circuits 10. That is, signals of the same frequency are supplied to the four superconducting qubit circuits 10.

In a manner similar to the first example embodiment, the coupling circuit 21 includes four sub-coupling circuits each including four capacitors and one Josephson junction. Specifically, the coupling circuit 21 includes a sub-coupling circuit 201A, a sub-coupling circuit 201B, a sub-coupling circuit 201C, and a sub-coupling circuit 201D.

In the following description, in a manner similar to the first example embodiment, when the sub-coupling circuits 201A, 201B, 201C, and 201D are referred to without any particular distinction between them, they are referred to as sub-coupling circuits 201.

In a manner similar to the first example embodiment, when Josephson junctions 210A, 210B, 210C, and 210D of the sub-coupling circuits 201 are referred to without any particular distinction between them, they are referred to as Josephson junctions 210.

In a manner similar to the first example embodiment, when capacitors 220A_1, 220A_2, 220A_3, and 220A_4 of the sub-coupling circuit 201A are referred to without any particular distinction between them, they are referred to as capacitors 220A.

In a manner similar to the first example embodiment, when capacitors 220B_1, 220B_2, 220B_3, and 220B_4 of the sub-coupling circuit 201B are referred to without any particular distinction between them, they are referred to as capacitors 220B. In a manner similar to the first example embodiment, when capacitors 220C_1, 220C_2, 220C_3, and 220C_4 of the sub-coupling circuit 201C are referred to without any particular distinction between them, they are referred to as capacitors 220C. In a manner similar to the first example embodiment, when capacitors 220D_1, 220D_2, 220D_3, and 220D_4 of the sub-coupling circuit 201D are referred to without any particular distinction between them, they are referred to as capacitors 220D. In a manner similar to the first example embodiment, when the capacitors 220A, 220B, 220C, and 330D are referred to without any particular distinction between them, they are referred to as capacitors 220.

All of the four superconducting qubit circuits 10 are directly connected to all of the four sub-coupling circuits 201.

The sub-coupling circuit 201A is a circuit in which one Josephson junction 210A and four capacitors 220A_1, 220A_2, 220A_3, and 220A_4 are connected. The sub-coupling circuit 201B is a circuit in which one Josephson junction 210B and four capacitors 220B_1, 220B_2, 220B_3, and 220B_4 are connected. The sub-coupling circuit 201C is a circuit in which one Josephson junction 210C and four capacitors 220C_1, 220C_2, 220C_3, and 220C_4 are connected. The sub-coupling circuit 201D is a circuit in which one Josephson junction 210D and four capacitors 220D_1, 220D_2, 220D_3, and 220D_4 are connected.

In a manner similar to the first example embodiment, each of the four superconducting qubit circuits 10 is connected to either one of both terminals of the Josephson junction 210 of each of the four sub-coupling circuits 201 through any one of the four capacitors 220. Also in this example embodiment, each sub-coupling circuit 201 has a different combination of superconducting qubit circuits 10 connected to the respective terminals of one Josephson junction 210.

Specifically, in this example embodiment, each superconducting qubit circuit 10 is connected to the four sub-coupling circuits 201 as follows.

A superconducting qubit circuit 10A, a superconducting qubit circuit 10B, and a superconducting qubit circuit 10C are connected to one terminal 211A of the Josephson junction 210A of the sub-coupling circuit 201A. More specifically, the superconducting qubit circuit 10A is connected to the terminal 211A through the capacitor 220A_1. The superconducting qubit circuit 10B is connected to the terminal 211A through the capacitor 220A_2. The superconducting qubit circuit 10C is connected to the terminal 211A through the capacitor 220A_3. The superconducting qubit circuit 10D is connected to the other terminal 212A of the Josephson junction 210A of the sub-coupling circuit 201A. More specifically, the superconducting qubit circuit 10D is connected to the terminal 212A through the capacitor 220A_4.

The superconducting qubit circuit 10A, the superconducting qubit circuit 10B, and the superconducting qubit circuit 10D are connected to one terminal 211B of the Josephson junction 210B of the sub-coupling circuit 201B. More specifically, the superconducting qubit circuit 10A is connected to the terminal 211B through the capacitor 220B_1. The superconducting qubit circuit 10B is connected to the terminal 211B through the capacitor 220B_2. The superconducting qubit circuit 10D is connected to the terminal 211B through the capacitor 220B_4. The superconducting qubit circuit 10C is connected to the other terminal 212B of the Josephson junction 210B of the sub-coupling circuit 201B. More specifically, the superconducting qubit circuit 10C is connected to the terminal 212B through the capacitor 220B_3.

The superconducting qubit circuit 10A, the superconducting qubit circuit 10C, and the superconducting qubit circuit 10D are connected to one terminal 211C of the Josephson junction 210C of the sub-coupling circuit 201C. More specifically, the superconducting qubit circuit 10A is connected to the terminal 211C through the capacitor 220C_1. The superconducting qubit circuit 10C is connected to the terminal 211C through the capacitor 220C_3. The superconducting qubit circuit 10D is connected to the terminal 211C through the capacitor 220C_4. The superconducting qubit circuit 10B is connected to the other terminal 212C of the Josephson junction 210C of the sub-coupling circuit 201C. More specifically, the superconducting qubit circuit 10B is connected to the terminal 212C through the capacitor 220C_2.

The superconducting qubit circuit 10B, the superconducting qubit circuit 10C, and the superconducting qubit circuit 10D are connected to one terminal 211D of the Josephson junction 210D of the sub-coupling circuit 201D. More specifically, the superconducting qubit circuit 10B is connected to the terminal 211D through the capacitor 220D_2. The superconducting qubit circuit 10C is connected to the terminal 211D through the capacitor 220D_3. The superconducting qubit circuit 10D is connected to the terminal 211D through the capacitor 220D_4. The superconducting qubit circuit 10A is connected to the other terminal 212D of the Josephson junction 210D of the sub-coupling circuit 201D. More specifically, the superconducting qubit circuit 10A is connected to the terminal 212D through the capacitor 220D_1.

Note that the condition of the capacitance of the capacitor 220 of each sub-coupling circuit 201 and the condition of the critical current value of the Josephson junction 210 are also the same as those according to the first example embodiment.

The interaction term of the Hamiltonian of the superconducting circuit 2 shown in FIG. 3 will now be described. When the interaction term is calculated under the condition that signals of the same frequency are supplied to the four superconducting qubit circuits 10, the interaction term becomes only the term for the interaction of the four bodies shown by the following Formula (3).

$$[\text{Interaction term}] = E_J \cos[\varphi_1 + \varphi_2 + \varphi_3 - \varphi_4] + E_J \cos[\varphi_1 + \varphi_2 - \varphi_3 + \varphi_4] + E_J \cos[\varphi_1 - \varphi_2 + \varphi_3 + \varphi_4] + E_J \cos[-\varphi_1 + \varphi_2 + \varphi_3 + \varphi_4] \quad (3)$$

In Formula (3), $\varphi_1$ is a phase of the superconducting qubit circuit 10A, $\varphi_2$ is a phase of the superconducting qubit circuit 10B, $\varphi_3$ is a phase of the superconducting qubit circuit 10C, and $\varphi_4$ is a phase of the superconducting qubit circuit 10D. $E_J$ is Josephson energy of the Josephson junction 210.

In a manner similar to the first example embodiment, there are 16 combinations of ($\varphi_1$, $\varphi_2$, $\varphi_3$, $\varphi_4$), which is 2 to the power of 4. Among the 16 combinations, there are eight combinations in which the number of upward spins is zero, two, or four. In this example embodiment, in any of these eight combinations, the above interaction term has the same value, which is the first value, as $4E_J \cos[2\varphi_0]$. On the other hand, there are a total of eight combinations in which the number of upward spins is one or three. In this example embodiment, in any of these eight combinations, the above interaction term has the same value, which is the second value, as $E_J(3+\cos[4\varphi_0])$. In other words, when the number of superconducting qubit circuits 10 to be in the first phase state among the four superconducting qubit circuits 10 is an even number, the interaction term of the Hamiltonian of the superconducting circuit 2 takes the first value. When the number of superconducting qubit circuits 10 to be the first phase state among the four superconducting qubit circuits 10 is an odd number, the interaction term of the Hamiltonian of the superconducting circuit 2 takes the second value.

As described above, also in this example embodiment, a circuit satisfying the four-body interaction, which is a constraint required by the LHZ scheme, is implemented using a plurality of superconducting qubit circuits 10 to which signals of the same frequency are supplied.

The superconducting circuits shown in the first and second example embodiments can also be expressed as follows. The superconducting circuit has a plurality of superconducting qubit circuits 10 and the coupling circuit 20 or 21 directly connected to the plurality of superconducting qubit circuits 10. The coupling circuit 20 or 21 includes the plurality of sub-coupling circuits 200 or 201 each including the plurality of capacitors 220 and one Josephson junction 210. Each of the plurality of superconducting qubit circuits 10 is connected to either one of the both terminals of the Josephson junction 210 of the plurality of the sub-coupling circuits 200 or 201 through any one of the plurality of capacitors 220. Each of the sub-coupling circuits 200 and 201 has a different combination of superconducting qubit circuits 10 connected to the respective terminals of the Josephson junction 210.

Third Example Embodiment

Next, an example embodiment of a quantum computer composed of the superconducting qubit circuit 10 which is a superconducting parametric oscillator and the coupling circuit 20 or 21 shown in the first or second example embodiment will be described. The quantum computer is a quantum annealing computer that calculates a solution of any problem that can be mapped to the Ising model. As described above, the superconducting parametric oscillator performs parametric oscillation when an alternating magnetic field having a frequency twice the resonance frequency is applied to the loop circuit 110. The oscillation state at this time can be either a first oscillation state and a second oscillation state. The phase of the oscillation in the first oscillation state and the phase of the oscillation in the second oscillation state differ from each other by $\pi$. The first oscillation state and the second oscillation state correspond to 0 and 1, respectively, of the quantum bits.

Figure 4:
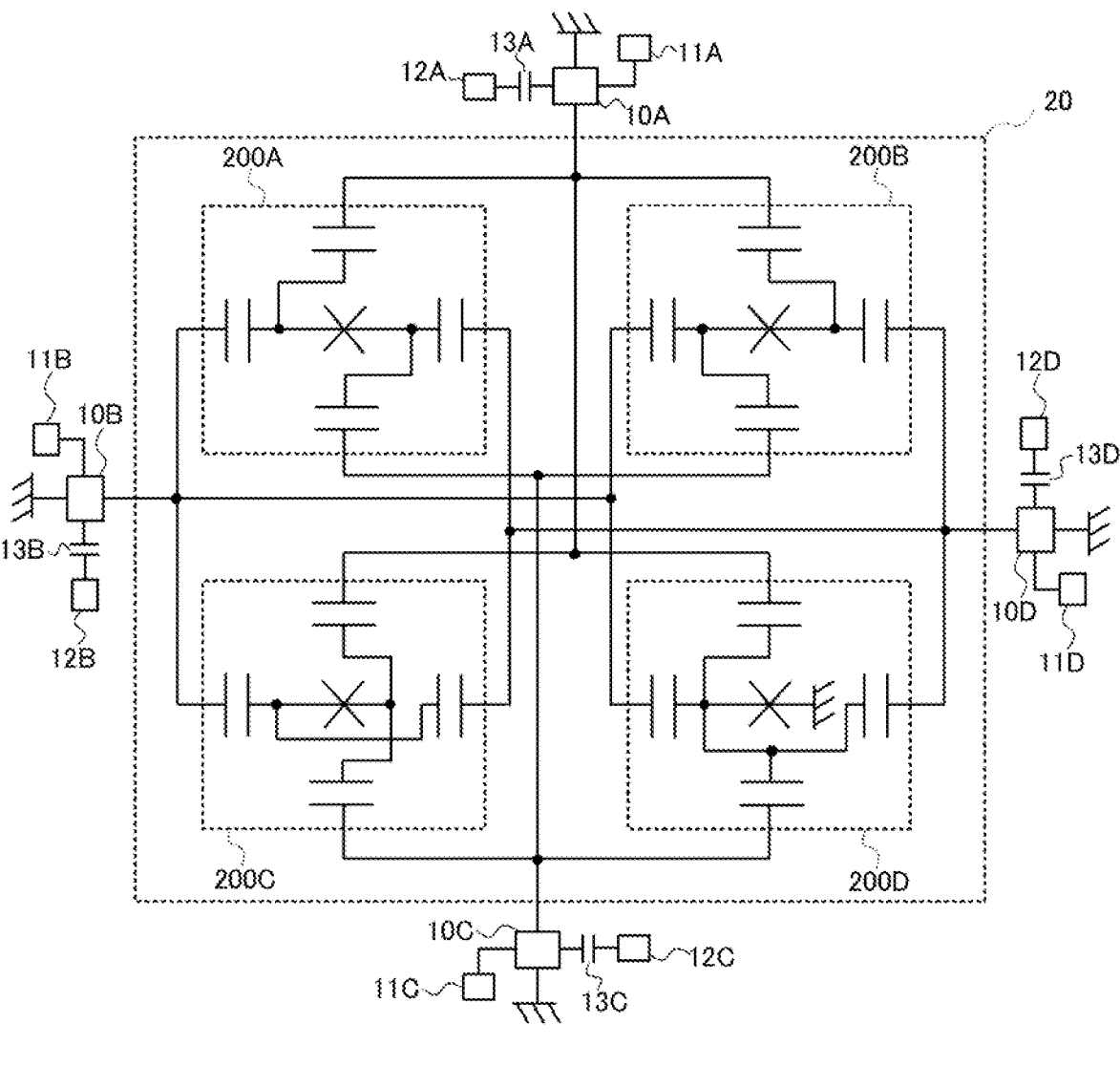
FIG. 4 is a schematic diagram showing a configuration of a quantum computer 3 using the superconducting qubit circuit and a coupling circuit shown in the first example embodiment.

FIG. 4 is a schematic diagram showing a configuration of a quantum computer 3 using the superconducting qubit circuits 10 and the coupling circuit 20 shown in the first example embodiment. The configuration of FIG. 4 shows that, in the configuration of a quantum computer using the superconducting parametric oscillator described in Non Patent Literature 2, the coupling circuit 20 according to the first example embodiment is employed as a circuit for coupling the superconducting parametric oscillators. The quantum computer 3 is a computer in which the superconducting qubit circuits 10 are coupled by the LHZ scheme.

In the quantum computer 3 shown in FIG. 4, four superconducting qubit circuits 10 (the superconducting parametric oscillators) are connected by one coupling circuit 20. Specifically, the coupling circuit 20 is connected to the loop circuit in which the loop circuit 110 and the capacitor 120 are connected in a ring shape in the superconducting qubit circuit 10. A control unit 11A is connected to the superconducting qubit circuit 10A and a reading unit 12A is connected to the superconducting qubit circuit 10A through a capacitor 13A. Similarly, a control unit 11B is connected to the superconducting qubit circuit 10B and a reading unit 12B is connected to the superconducting qubit circuit 10B through a capacitor 13B. A control unit 11C is connected to the superconducting qubit circuit 10C and a reading unit 12C is connected to the superconducting qubit circuit 10C through a capacitor 13C. A control unit 11D is connected to the superconducting qubit circuit 10D and a reading unit 12D is connected to the superconducting qubit circuit 10D through a capacitor 13D.

In the following description, when the control units 11A, 11B, 11C, and 11D are referred to without any particular distinction between them, they are referred to as the control units 11. When the reading units 12A, 12B, 12C, and 12D are referred to without any particular distinction between them, they are referred to as the reading units 12. Further, when the capacitors 13A, 13B, 13C, and 13D are referred to without any particular distinction between them, they are referred to as the capacitors 13.

Figure 5:
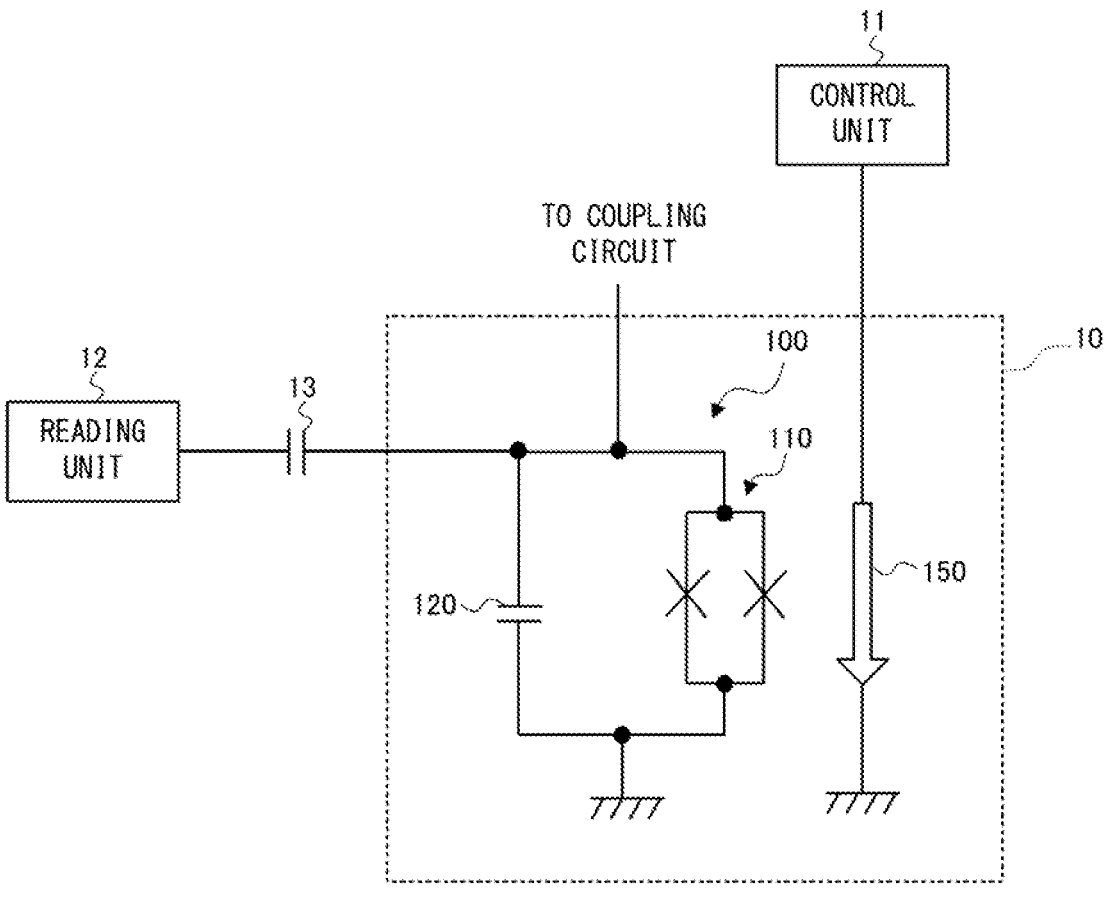
FIG. 5 is a schematic diagram showing a configuration for controlling and reading the superconducting qubit circuit.

FIG. 5 is a schematic diagram showing a configuration for controlling and reading the superconducting qubit circuit 10 according to this example embodiment. The control unit 11 is a circuit that is connected to the magnetic field generation unit 150 of the superconducting qubit circuit 10, and supplies, to the magnetic field generation unit 150, a direct current for controlling an oscillation frequency of the superconducting qubit circuit 10 and an alternating current for oscillating the superconducting qubit circuit 10. In this example embodiment, for all superconducting qubit circuits 10, the control units 11 supply the alternating currents of the same frequency to the magnetic field generation units 150.

The reading unit 12 is a circuit that is connected to the resonator 100 through the capacitor 13, and reads out an internal state of the superconducting qubit circuit 10, namely, the oscillation state. In the configuration shown in FIG. 5, the reading unit 12 is connected to the loop circuit in which the loop circuit 110 and the capacitor 120 are connected in a ring shape via the capacitor 13.

Although the coupling circuit 20 according to the first example embodiment is used in FIG. 4, the coupling circuit 21 according to the second example embodiment may be used instead.

Figure 6:
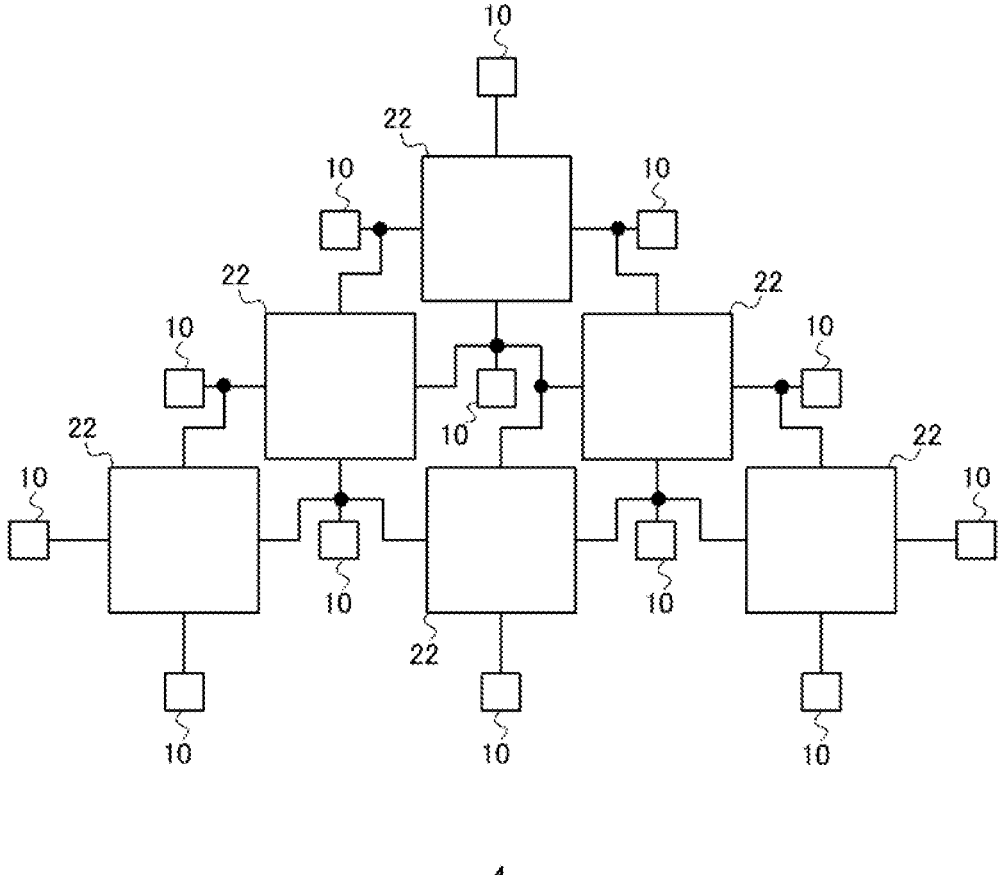
FIG. 6 is a schematic diagram showing a configuration of a quantum computer in which superconducting circuits are integrated.

Although the configuration shown in FIG. 4 shows the configuration of a quantum computer when there are four superconducting qubit circuits 10, more superconducting qubit circuits 10 may be integrated. It is possible to realize a quantum computer in which an arbitrary number of superconducting qubit circuits 10 are integrated by using the configuration shown in FIG. 4 as a unit structure and connecting a plurality of such unit structures side by side. That is, a quantum computer having the superconducting circuit 1 according to the first example embodiment or the superconducting circuit 2 according to the second example embodiment as a unit structure may be constituted. An example of the configuration is shown in FIG. 6. FIG. 6 is a schematic diagram showing a configuration of a quantum computer 4 in which the superconducting qubit circuits 10 are integrated. In FIG. 6, each of the coupling circuits 22 indicates either the coupling circuit 20 according to the first example embodiment described above or the coupling circuit 21 according to the second example embodiment described above. In the configuration shown in FIG. 6, as shown in FIGS. 1, 3, and 4, each coupling circuit 22 is connected to four superconducting qubit circuits 10. Further, each superconducting qubit circuit 10 is connected to one to four coupling circuits 22, and the superconducting qubit circuits 10 are arranged while shared (i.e., commonly used) by a plurality of unit structures, so that the unit structures shown in FIG. 4 is obtained. In the quantum computer 4, at least one superconducting qubit circuit 10 is connected to the plurality of coupling circuits 22. In particular, in the example shown in FIG. 6, at least one superconducting qubit circuit 10 is connected to the four coupling circuits 22. The quantum computer 4 can also be described as follows. The quantum computer 4 includes the plurality of superconducting qubit circuits 10, and each superconducting qubit circuit 10 is connected to one to four coupling circuits 22. The number of coupling circuits 22 to which respective superconducting qubit circuits 10 are connected corresponds to the number of unit structures in which these superconducting qubit circuits 10 are shared. Thus, in the example shown in FIG. 6, the quantum computer 4 includes a plurality of unit structures, and the superconducting qubit circuit 10 is shared by the plurality of unit structures. In the example shown in FIG. 6, 13 superconducting qubit circuits 10 are integrated, but any number of superconducting qubit circuits 10 can be integrated in a manner similar to this.

In FIG. 6, the control units 11 and the reading units 12 are not shown in the drawings for the sake of easy understanding of the drawings. However, actually the control and reading of the superconducting qubit circuit 10 are performed using the control units 11 and the reading units 12. Further, the operation principle and the control method of the quantum computer are described in Non Patent Literature 2, and the operation principle and the control method described in Non Patent Literature 2 are also applied to the quantum computer shown in FIGS. 4 and 6.

According to this example embodiment, it is possible to provide a quantum computer that implements a circuit satisfying the four-body interaction, which is a constraint required by the LHZ scheme, using a plurality of superconducting qubit circuits 10 to which signals of the same frequency are supplied. Therefore, the configuration can be simplified.

Note that the present disclosure is not limited to the above-described example embodiments, and may be appropriately modified without departing from the scope of the disclosure.

Although the present disclosure has been described with reference to the example embodiments, the present disclosure is not limited to the above. The configurations and details of the present disclosure may be modified in various ways that could be understood by those skilled in the art within the scope of the disclosure.

This application claims priority on the basis of Japanese Patent Application No. 2019-133819, filed Jul. 19, 2019, the entire disclosure of which is incorporated herein by reference.

REFERENCE SIGNS LIST

1 SUPERCONDUCTING CIRCUIT
2 SUPERCONDUCTING CIRCUIT
3 QUANTUM COMPUTER
4 QUANTUM COMPUTER
10 SUPERCONDUCTING QUBIT CIRCUIT
11 CONTROL UNIT
12 READING UNIT
13 CAPACITOR
20 COUPLING CIRCUIT
21 COUPLING CIRCUIT
22 COUPLING CIRCUIT
100 RESONATOR
101 SUPERCONDUCTING LINE
102 SUPERCONDUCTING LINE
103 JOSEPHSON JUNCTION
104 JOSEPHSON JUNCTION
105 FIRST PART
106 SECOND PART
110 LOOP CIRCUIT
120 CAPACITOR
150 MAGNETIC FIELD GENERATION UNIT
200 SUB-COUPLING CIRCUIT
201 SUB-COUPLING CIRCUIT
210 JOSEPHSON JUNCTION
211 TERMINAL
212 TERMINAL
220 CAPACITOR

What is claimed is:

1. A superconducting circuit comprising:

four superconducting qubit circuits; and a coupling circuit directly connected to the four superconducting qubit circuits, wherein each of the superconducting qubit circuits indicates a qubit by being in a first phase state or a second phase state, when the number of the superconducting qubit circuits in the first phase state among the four superconducting qubit circuits is an even number, an interaction term of Hamiltonian of the superconducting circuit takes a first value, when the number of the superconducting qubit circuits in the first phase state among the four superconducting qubit circuits is an odd number, the interaction term takes a second value, the coupling circuit includes four sub-coupling circuits each including four capacitors and one Josephson junction, each of the four superconducting qubit circuits is connected to either one of both terminals of the Josephson junction of each of the four sub-coupling circuits through any one of the four capacitors, and each sub-coupling circuit has a different combination of the superconducting qubit circuits connected to the respective terminals of the Josephson junction.

2. The superconducting circuit according to claim 1, wherein the interaction term of the Hamiltonian of the superconducting circuit is expressed by the following formula, in which $\varphi_1$, $\varphi_2$, $\varphi_3$, and $\varphi_4$ are phases of the four superconducting qubit circuits, and $E_J$ is Josephson energy of the Josephson junction:

$$E_J \cos[\varphi_1+\varphi_2-\varphi_3-\varphi_4]+E_J \cos[-\varphi_1+\varphi_2+\varphi_3-\varphi_4]+E_J \cos[-\varphi_1+\varphi_2-\varphi_3+\varphi_4]+E_J \cos[\varphi_1+\varphi_2+\varphi_3+\varphi_4].$$

3. The superconducting circuit according to claim 2, wherein the four superconducting qubit circuits are a first superconducting qubit circuit, a second superconducting qubit circuit, a third superconducting qubit circuit, and a fourth superconducting qubit circuit, respectively, the four sub-coupling circuits are a first sub-coupling circuit, a second sub-coupling circuit, a third sub-coupling circuit, and a fourth sub-coupling circuit, respectively, the first superconducting qubit circuit and the second superconducting qubit circuit are connected to one terminal of the Josephson junction of the first sub-coupling circuit, and the third superconducting qubit circuit and the fourth superconducting qubit circuit are connected to another terminal of the Josephson junction of the first sub-coupling circuit, the second superconducting qubit circuit and the third superconducting qubit circuit are connected to one terminal of the Josephson junction of the second sub-coupling circuit, and the first superconducting qubit circuit and the fourth superconducting qubit circuit are connected to another terminal of the Josephson junction of the second sub-coupling circuit, the second superconducting qubit circuit and the fourth superconducting qubit circuit are connected to one terminal of the Josephson junction of the third sub-coupling circuit, and the first superconducting qubit circuit and the third superconducting qubit circuit are connected to another terminal of the Josephson junction of the third sub-coupling circuit, and the first superconducting qubit circuit, the second superconducting qubit circuit, the third superconducting qubit circuit, and the fourth superconducting qubit circuit are connected to one terminal of the Josephson junction of the fourth sub-coupling circuit, and another terminal of the Josephson junction of the fourth sub-coupling circuit is grounded.

4. The superconducting circuit according to claim 1, wherein the interaction term of the Hamiltonian of the superconducting circuit is expressed by the following formula, in which $\varphi_1$, $\varphi_2$, $\varphi_3$, and $\varphi_4$ are phases of the four superconducting qubit circuits, and $E_J$ is Josephson energy of the Josephson junction:

$$E_J \cos[\varphi_1+\varphi_2+\varphi_3-\varphi_4]+E_J \cos[\varphi_1+\varphi_2-\varphi_3+\varphi_4]+E_J \cos[\varphi_1-\varphi_2+\varphi_3+\varphi_4]+E_J \cos[-\varphi_1+\varphi_2+\varphi_3+\varphi_4].$$

5. The superconducting circuit according to claim 4, wherein the four superconducting qubit circuits are a first superconducting qubit circuit, a second superconducting qubit circuit, a third superconducting qubit circuit, and a fourth superconducting qubit circuit, respectively, the four sub-coupling circuits are a first sub-coupling circuit, a second sub-coupling circuit, a third sub-coupling circuit, and a fourth sub-coupling circuit, respectively, the first superconducting qubit circuit, the second superconducting qubit circuit, and the third superconducting qubit circuit are connected to one terminal of the Josephson junction of the first sub-coupling circuit, and the fourth superconducting qubit circuit is connected to another terminal of the Josephson junction of the first sub-coupling circuit, the first superconducting qubit circuit, the second superconducting qubit circuit, and the fourth superconducting qubit circuit are connected to one terminal of the Josephson junction of the second sub-coupling circuit, and the third superconducting qubit circuit is connected to another terminal of the Josephson junction of the second sub-coupling circuit, the first superconducting qubit circuit, the third superconducting qubit circuit, and the fourth superconducting qubit circuit are connected to one terminal of the Josephson junction of the third sub-coupling circuit, and the second superconducting qubit circuit is connected to another terminal of the Josephson junction of the third sub-coupling circuit, and the second superconducting qubit circuit, the third superconducting qubit circuit, and the fourth superconducting qubit circuit are connected to one terminal of the Josephson junction of the fourth sub-coupling circuit, and the first superconducting qubit circuit is connected to another terminal of the Josephson junction of the fourth sub-coupling circuit.

6. A quantum computer comprising, as a unit structure, the superconducting circuit according to claim 1.

7. The quantum computer according to claim 6 comprising:

a plurality of the unit structures, wherein the superconducting qubit circuit is shared by the plurality of the unit structures.

8. A superconducting circuit comprising:

a plurality of superconducting qubit circuits; and a coupling circuit directly connected to the plurality of superconducting qubit circuits, wherein the coupling circuit includes a plurality of sub-coupling circuits each including a plurality of capacitors and one Josephson junction, each of the plurality of superconducting qubit circuits is connected to either one of both terminals of the Josephson junction of each of the plurality of sub-coupling circuits through any one of the plurality of capacitors, and each sub-coupling circuit has a different combination of the superconducting qubit circuits connected to the respective terminals of the Josephson junction.

* * * * *